(12) United States Patent
Herzl et al.

(10) Patent No.: US 8,060,845 B2
(45) Date of Patent: Nov. 15, 2011

(54) MINIMIZING IMPACT OF DESIGN CHANGES FOR INTEGRATED CIRCUIT DESIGNS

(75) Inventors: Robert D. Herzl, South Burlington, VT (US); Robert S. Horton, Colchester, VT (US); Kenneth A. Lauricella, Colchester, VT (US); David W. Milton, Underhill, VT (US); Clarence R. Ogilvie, Huntington, VT (US); Paul M. Schanely, Essex Junction, VT (US); Nitin Sharma, South Burlington, VT (US); Tad J. Wilder, South Hero, VT (US); Charles B. Winn, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 12/173,222

(22) Filed: Jul. 15, 2008

(65) Prior Publication Data

US 2010/0017773 A1 Jan. 21, 2010

(51) Int. Cl.
*G06F 17/50* (2006.01)
(52) U.S. Cl. .......................... 716/103; 716/104; 716/132
(58) Field of Classification Search .................. None
See application file for complete search history.

(56) References Cited

U.S. PATENT DOCUMENTS

| | | | | |
|---|---|---|---|---|
| 5,446,675 A * | 8/1995 | Yoshimura | | 716/103 |
| 5,983,277 A * | 11/1999 | Heile et al. | | 709/232 |
| 6,134,705 A * | 10/2000 | Pedersen et al. | | 716/103 |
| 6,298,319 B1 * | 10/2001 | Heile et al. | | 703/26 |
| 6,453,454 B1 * | 9/2002 | Lee et al. | | 716/102 |
| 6,484,292 B1 * | 11/2002 | Jain et al. | | 716/104 |
| 6,490,717 B1 * | 12/2002 | Pedersen et al. | | 716/104 |
| 6,530,073 B2 | 3/2003 | Morgan | | |
| 6,668,362 B1 | 12/2003 | McIlwain et al. | | |
| 7,086,029 B1 * | 8/2006 | Barras et al. | | 716/103 |
| 7,143,375 B2 | 11/2006 | Maruyama et al. | | |
| 2007/0028204 A1 * | 2/2007 | Takeda | | 716/18 |

OTHER PUBLICATIONS

Gu et al., "Unified Incremental Physical-Level and High-Level Synthesis," IEEE Trans. on CAD of ICs and Systems, vol. 26, No. 9, Sep. 2007, pp. 1576-1588.*
Jones, "Fast Batch and Incremental Netlist Compilation of Hierarchical Schematics," IEEE Trans. on CAD, vol. 10, No. 7, Jul. 1991, pp. 922-931.*
Kirovski et al., "Engineering Change Protocols for Behavioral and System Synthesis," IEEE Trans. on CAD of ICs and Systems, vol. 24, No. 8, Aug. 2005, pp. 1145-1155.*
Lin et al., "Logic Synthesis for Engineering Change," IEEE Trans. on CAD of ICs and Systems, vol. 18, No. 3, Mar. 1999, pp. 282-292.*

(Continued)

*Primary Examiner* — Leigh Garbowski
(74) *Attorney, Agent, or Firm* — Wood, Herron & Evans, LLP

(57) ABSTRACT

A method is provided for updating an existing netlist to reflect a design change. A register transfer level (RTL) design incorporating the design change and the existing netlist are provided to a synthesis tool. The existing netlist is set to a read-only condition to prevent a change to the existing netlist. The design and the read-only existing netlist are processed with the synthesis tool reusing logic structures from the read-only existing netlist by performing an optimization of the design and the read-only existing netlist with an objective to minimize the design space. The optimization is constrained by the read-only existing netlist. A result is generated by the synthesis tool including the existing netlist and a new portion of a netlist reflecting the design change.

6 Claims, 3 Drawing Sheets

OTHER PUBLICATIONS

Prasad et al., "A system for incremental synthesis to gate-level and reoptimization following RTL design changes," 31st ACM/IEEE Design Automation Conference, 1994, pp. 441-446.*

Roy et al., "ECO-System: Embracing the Change in Placement," IEEE Trans. on CAD of ICs and Systems, vol. 26, No. 12, Dec. 2007, pp. 2173-2185.*

Shinsha et al., "Incremental Logic Synthesis Through Gate Logic Structure Identification," 23rd Design Automation Conference, 1986, pp. 391-397.*

Brand et al., "Incremental Synthesis," 1994 ACM, pp. 14-18.*

Giomi et al., "An Incremental Synthesis Method for ASIC Design," 1992 IEEE, pp. 158-161.*

* cited by examiner

MINIMIZING IMPACT OF DESIGN CHANGES FOR INTEGRATED CIRCUIT DESIGNS

BACKGROUND

The present invention relates generally to integrated circuits and, more particularly, to methods for synthesizing an integrated circuit design.

Logic synthesis is a process by which an abstract form of desired circuit behavior (typically register transfer level (RTL)) is turned into a design implementation in terms of logic gates. Typical practical implementations of a logic function utilize a multilevel network of logic elements. Starting from an RTL description of a design, a synthesis tool constructs a corresponding multilevel Boolean network. Next, this network is optimized using several technology-independent techniques before technology-dependent optimizations are performed.

Finally, technology-dependent optimization transforms the technology-independent circuit into a network of gates in a given technology. Mapping is constrained by factors such as the available gates (logic functions) in the technology library, the drive sizes for each gate, and the delay, power, and area characteristics of each gate. The result of this synthesis is generally a netlist, which describes the connectivity of an electronic design.

After synthesis, the resulting netlist is used for placement and routing of the gates and other components, as well as used for additional simulations such as timing. Because the synthesis and optimization are highly numerical processes, the results generated by these processes may be very path dependent. Because of the numerical aspects of the path dependency, a side effect of synthesis tools is that generated netlists may be very different based on small changes in inputs, causing extensive efforts and repetitive work for placement, routing and timing of any updated designs.

In an ASIC chip development process, for example, once the logic synthesis and initial place and route stage have taken place, any engineering change due to RTL modification is a very complicated and time consuming task, potentially adding delay to the development process. The development process is taxed due to last minute RTL changes, as a complete new netlist is generated every time such a change occurs, forcing a time consuming manual processes to find minimal changes in the new netlist (when the new RTL has induce some additional change) as compared to the previous design.

What is needed therefore is a process that minimizes the impact of design changes late in the product development process.

BRIEF SUMMARY

Embodiments of the invention provide a method of updating an existing netlist to reflect a change in an integrated circuit design change. A register transfer level (RTL) design incorporating the design change and the existing netlist are provided to a synthesis tool. The existing netlist is set to a read-only condition to prevent a change to the existing netlist. The design and the read-only existing netlist are synthesized in a combined manner with the synthesis tool, which reuses logic structures from the read-only existing netlist by performing an optimization of the design and the read-only existing netlist with an objective to minimize the design space. The optimization is constrained by the read-only existing netlist. A result generated by the synthesis tool includes both the read-only existing netlist and a new portion of a netlist reflecting the design change. In some embodiments, the synthesis tool may perform an optimization of the existing netlist and the new design with an objective to minimize the design space. The existing netlist may act as a constraint on the optimization and may prevent changes to the existing netlist.

After the generation of the new netlist, the existing netlist may then be updated with the new portion of the netlist reflecting the design change. Modifying the existing netlist generally entails matching inputs and outputs of a portion of the existing netlist with the new portion of the netlist generated by the synthesis tool. Then a portion of the existing netlist may be replaced with the new portion of the netlist to reflect the design change. In some embodiments, modifying the existing netlist may be performed by the synthesis tool. Once the netlist has been updated, other post-processing functions such as updating placement, routing, and timing may be performed using the modified netlist. In some embodiments the new design may be provided in the form of a netlist. In other embodiments, the new design may be provided in the form of an RTL.

BRIEF DESCRIPTION OF THE SEVERAL VIEWS OF THE DRAWINGS

The accompanying drawings, which are incorporated in and constitute a part of this specification, illustrate embodiments of the invention and, together with a general description of the invention given above, and the detailed description given below, serve to explain the principles of the invention.

DETAILED DESCRIPTION

Embodiments of the invention assist in overcoming issues related to design changes after placement, routing, and timing analysis has been performed using an exiting netlist. The method presented in the embodiments of the invention provides an efficient way to perform minimal engineering changes to an existing netlist required by design changes. The method lends itself to automation thereby reducing manual efforts at later stages in the design cycle, as well as aiding the overall chip development process by reducing efforts for timing, layout, etc. for engineering changes, which may occur late in the design cycle.

As disclosed above, ASIC designs are generally delivered in an RTL format, which is synthesized with known synthesis tools, generating a netlist. This netlist is then used for downstream design applications such as gate placement, routing between the components, and analysis such as timing analysis, confirming that the design meets the specifications. When changes are made to an ASIC design, a new RTL is provided and synthesized, resulting in a new netlist. Because the synthesis process may be path dependent, the netlist resulting from the changes RTL may be vastly different from the original netlist, even for small changes made to the ASIC design. The design from the new netlist may then require replacement and rerouting of the gates on the ASIC, resulting in long redesign times. Additionally, a preservation of the existing design becomes a tedious manual task, prone to errors and also adding to delays in the design time.

Figure 1A:
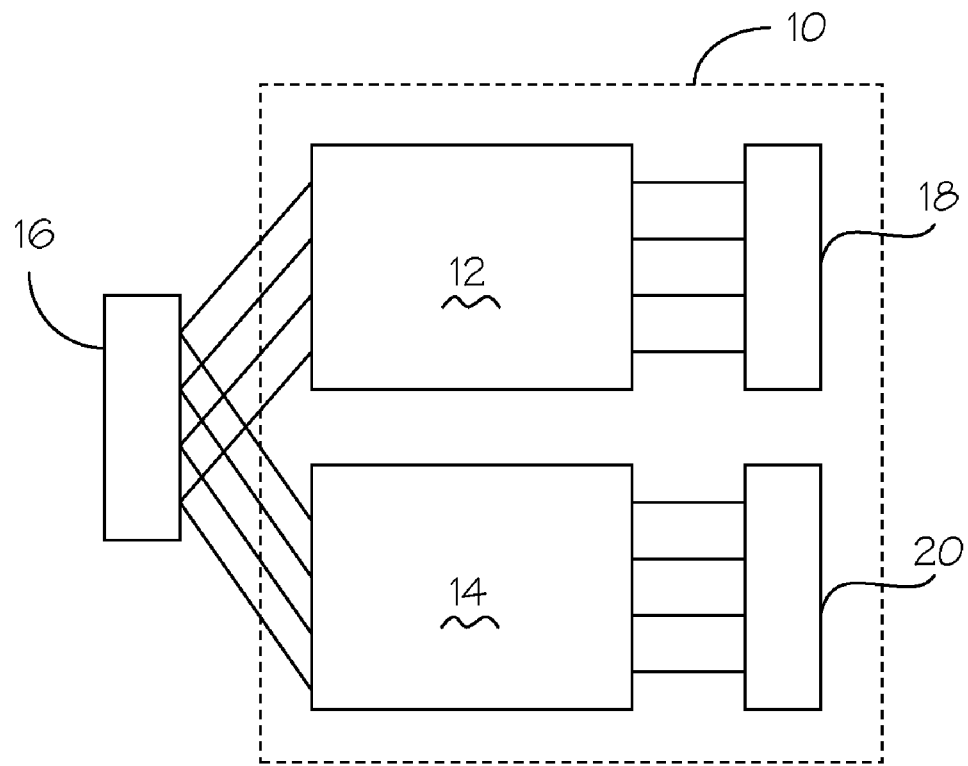
FIG. 1A is a diagrammatic representation of a design space for a combined synthesis of an existing netlist and a new design.

With reference now to FIG. 1A, the methodology presented for an exemplary embodiment of the invention uses a combined synthesis approach to preserve structure from earlier designs, thus minimizing engineering changes with design changes late in the process. As shown diagrammatically in FIG. 1A, a design space 10 contains both an existing netlist 12 and the new design in the form of an RTL 14, or in other embodiments, in the form of another netlist. The primary inputs 16 of the new RTL 14 and existing netlist 12 are combined. The contents of the existing netlist 12 are then given read-only type properties, ensuring that the primary outputs 18 of the existing netlist 12, as well as the netlist 12 itself, do not change their logic structure and logic functions. The new RTL 14 may also have a set of primary outputs 20 associated with the updated design. Depending on the magnitude of the design change in the new RTL 14, it is likely that there will be an overlap between the primary outputs 18 of the existing netlist 12 and the primary outputs 20 of the new RTL 14.

A synthesis is then performed on both the existing netlist 12 and the new RTL 14. An objective of the synthesis performed on the combined structures is to minimize the overall design space. The read-only existing netlist 12 acts as constraint on the objective resulting in the reuse of structure already defined in the existing netlist 12. The minimized design space is bounded by the two extremes. The first boundary exists where the new RTL 14 being synthesized is exactly the same as the design generating the existing netlist 12. A result of the synthesis in this case would be the existing netlist 12. At the other extreme, the new RTL 14 is a design completely different from the design generating the existing netlist 12. A result of the synthesis in this case would be two netlists, one, unchanged, for the existing netlist 12, and a new netlist 22 with no overlap, for the new RTL 14. In typical operation, the design space will generally be between these two extremes resulting in an unchanged netlist 12 and a smaller new netlist 22 representing the change to the design as seen in the diagrammatic representation in FIG. 1B.

Figure 1B:
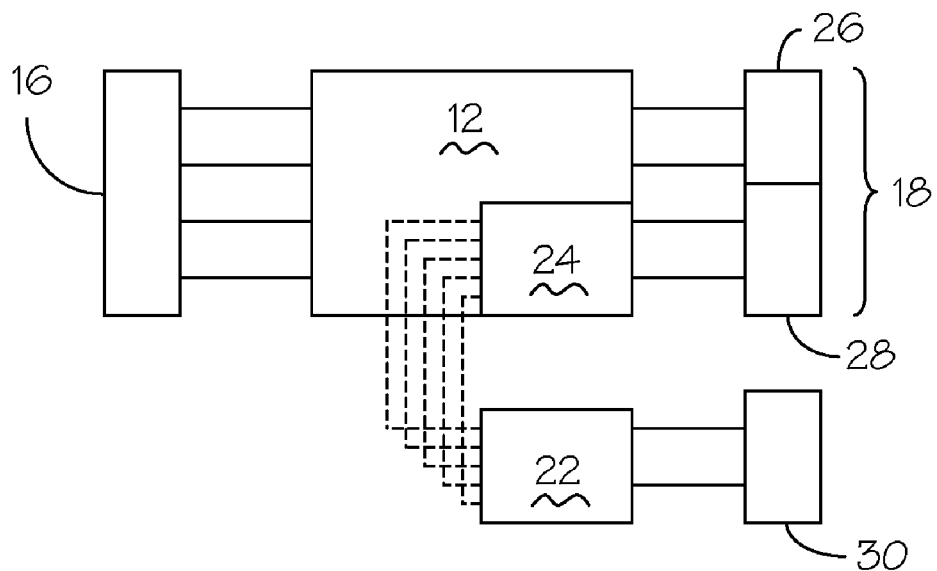
FIG. 1B is a diagrammatic representation of a result of the combined synthesis in FIG. 1A.

The new netlist corresponds to an old netlist 24 of the existing netlist 12. The new netlist 22 connects at points at the boundary of the old netlist 24 connecting the new netlist 22 to structure from the existing netlist 12 that has not changed as seen in FIG. 1B. Additionally, the primary outputs 18 of the existing netlist 12 are divided into outputs 26 corresponding to the unchanged portions of the netlist 12 and outputs 28 corresponding to the old netlist 24 of the netlist. Moreover, the new netlist 22 also has associated with it a set of new outputs 30. The old netlist 24 may now be removed from netlist 12 and the new netlist 22 may be connected. The result is shown diagrammatically in FIG. 1C. Because much of the existing netlist 12 has been preserved, placement and rerouting need only be performed for the new netlist 22. Similarly, timing may need only be performed on the new portions of the design, rather than the entire design.

Figure 1C:
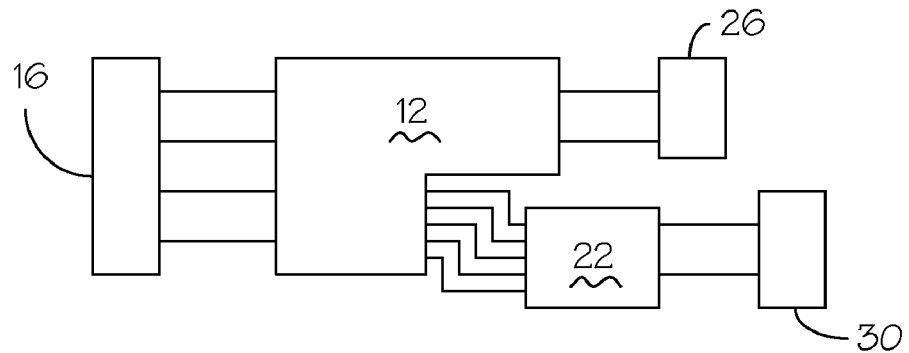
FIG. 1C is a diagrammatic representation of an addition of a new netlist to an existing netlist from the result of FIG. 1B.

Removal of the old netlist 24 of the existing netlist 12 and the addition of the new netlist 22 may be accomplished manually using existing editing tools known in the art. The manual process of removing the old netlist 24 and replacing it with the new netlist 22 may be greatly simplified due to the reuse of the majority of the existing netlist 12 in the new design. Generally the process includes matching inputs and outputs of a portion of the existing netlist 12 with the new netlist 22. Once matched, the old netlist 24 portion of the existing netlist 12 may be replaced with the new netlist 22. In some embodiments, the replacement of the old netlist 24 of the existing netlist 12 with the new netlist 22 may be automated. This automated process may be incorporated into the synthesis such that the after the optimization to reduce the design space 10 has completed, the synthesis tool may then create a new netlist 22 that is representative of the combination of parts of the existing netlist 12 and new netlist 22 as illustrated in FIG. 1C. Alternatively, the automated process may be a post-processing function performed by a separate module after the synthesis has completed. This post-processing step may be performed prior to steps for placement, routing, and/or timing.

Figure 2:
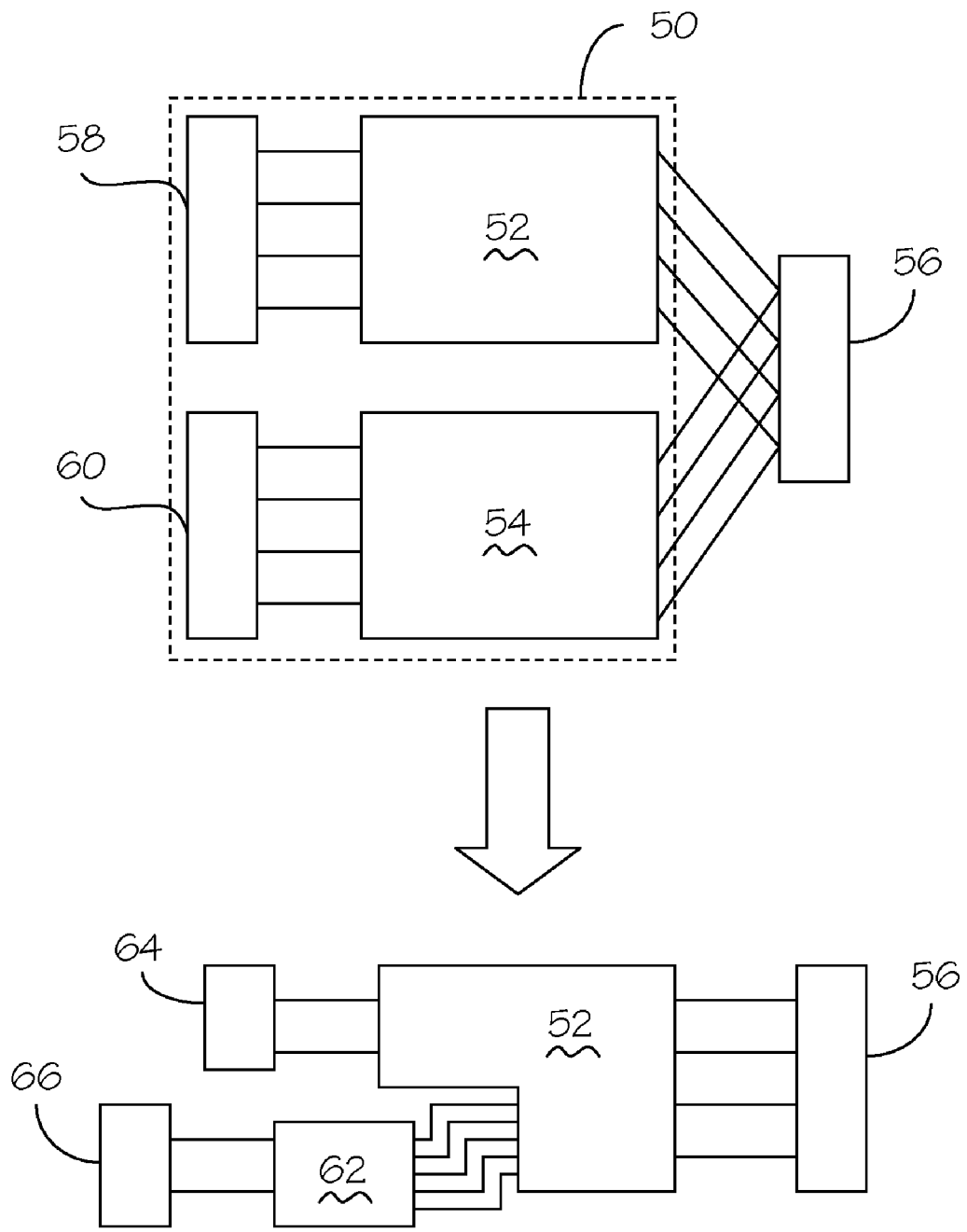
FIG. 2 is a diagrammatic representation of a design space for a combined synthesis of another existing netlist and new design and the resulting combination.

In an alternate embodiment, the new design may affect the inputs rather than the outputs. In this exemplary embodiment diagrammatically illustrated in FIG. 2, a design space 50 again contains an existing netlist 52 and a new RTL 54 representing the design change. In this embodiment, primary outputs 56 are connected to both the existing netlist 52 and the new RTL 54. Also in the design space are the inputs 58 for the existing netlist 52 and the inputs 60 for the new RTL. Similar to the embodiment above, the existing netlist 52 is set to a read-only state so that the structures in the netlist remain unchanged after the synthesis process. Again part of the synthesis process includes an objective function to minimize the design space, resulting in a new netlist 62 that represents the changes from the updated design. After the synthesis process has completed, as above with the previous embodiment, an old netlist may be removed and replaced with the new netlist 62. Inputs 64 belonging to the remainder of the existing netlist 52 and inputs 66 specific to the new netlist are also provided. Similar to the outputs of the embodiments above, the original inputs 58 for the existing netlist contain portions that are common to the existing and updated design. Those inputs 64 are preserved through the synthesis process by keeping the existing netlist 52 in a read-only condition. Also similar to embodiments disclosed above, the replacement of the old netlist with the new netlist 62 may be a manual process performed with existing editing tools, or the process may be an automated process performed during the synthesis process or as a post-processing step to the synthesis process.

Figure 3:
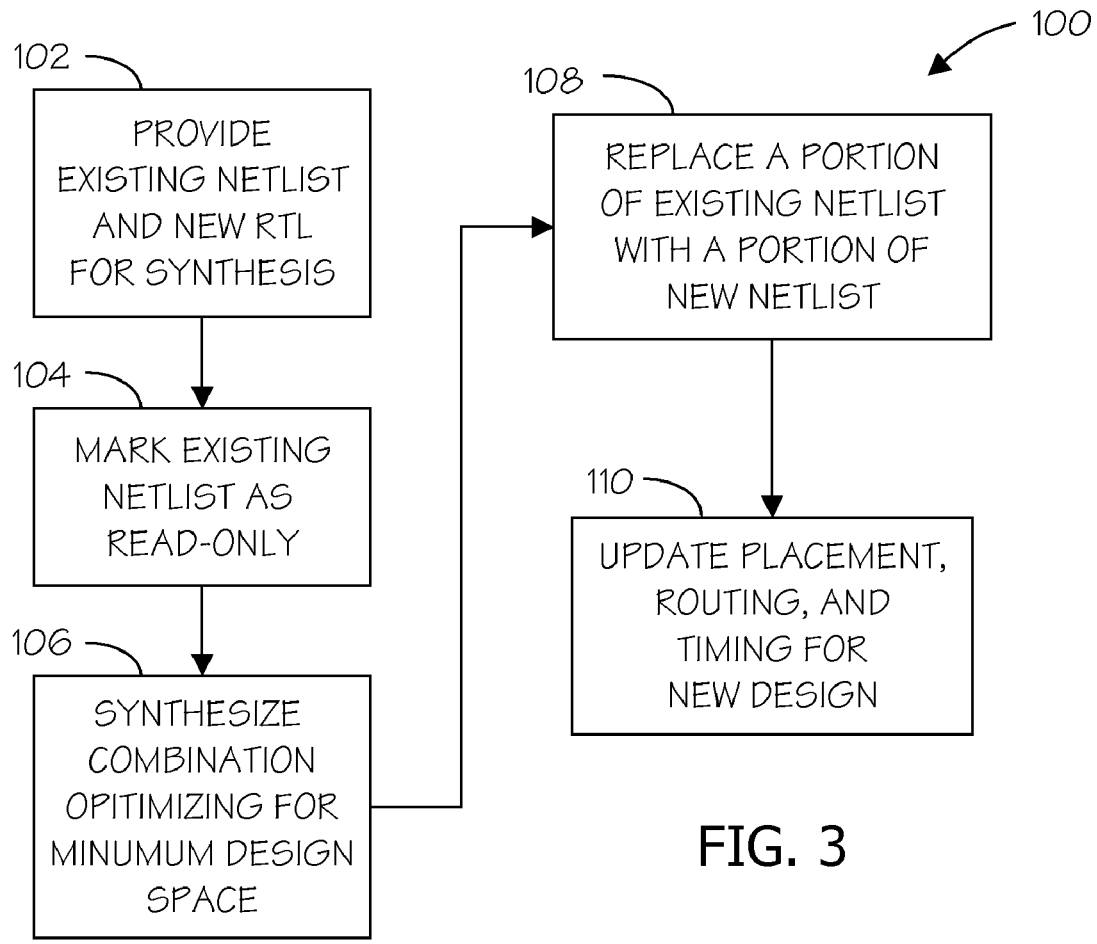
FIG. 3 is a flowchart of a process for performing a combined synthesis.

The process may be summarized by flowchart 100 in FIG. 3. An existing netlist and a new design change, in the form of a new RTL or a new netlist, may be provided to an existing synthesis tool (block 102). The existing netlist provided is marked as read-only (block 104) to prevent changes from being made to the existing netlist. The existing netlist and the new design are then subjected to a combined synthesis, optimizing the design space to a minimum (block 106). The read-only existing netlist acts as a constraint on the optimization, preserving and reusing as much of the existing structure as possible. As disclosed above, the bounds for the design space are the return of the original netlist if the new design is the same as the design that originally created the existing netlist as none of the structures would have changed. The other extreme is the creation of a complete second netlist if the new design is not related at all to the original design that created the existing netlist. In practice, the more common result will likely be the return of the existing netlist, and a new netlist that represents a portion of the existing netlist that has changed due to the design change.

Once the new netlist portion has been generated from the synthesis process, the new portion replaces part of the structure in the existing netlist (block 108), which generally preserves the majority of the original design. After the netlist has been updated, other post-processing steps such as placement, routing, and timing, related to the updated netlist may be performed (block 110). Because much of the existing structures may have been preserved from the previous designs, engineering changes occurring late in the design cycle may not have as large of an impact on production as the smaller changes may be incorporated more readily.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. For example, changes to the design may involve changes that affect both inputs and outputs simultaneously. Additionally, this methodology may be applied directly to new designs, using portions of existing netlists to impose certain structures in the design. Moreover, because the read-only netlists act as design constraints, multiple netlists may be used in a single design space for the combined synthesis. The invention in its broader aspects is therefore not limited to the specific details, representative apparatus and method, and illustrative examples shown and described. Accordingly, departures may be made from such details without departing from the scope of the general inventive concept.

What is claimed is:

1. A method of updating an existing netlist to reflect a design change, the method comprising:

providing a register transfer level (RTL) design incorporating the design change to a synthesis tool;

providing the existing netlist to the synthesis tool;

setting the existing netlist to a read-only condition to prevent a change to the existing netlist;

synthesizing the design and the read-only existing netlist with the synthesis tool reusing logic structures from the read-only existing netlist by performing an optimization of the design and the read-only existing netlist with an objective to minimize the design space, the optimization being constrained by the read-only existing netlist; and generating by the synthesis tool the existing read-only netlist and a portion of a new netlist reflecting the design change.

2. The method of claim 1 further comprising:

modifying the existing netlist with the portion of the new netlist reflecting the change.

3. The method of claim 2 wherein modifying the existing netlist comprises:

matching inputs and outputs of a portion of the existing netlist with the portion of the new netlist; and replacing the portion of the existing netlist with the portion of the new netlist.

4. The method of claim 2 wherein the modification of the existing netlist is performed by the synthesis tool.

5. The method of claim 2 further comprising:

updating placement, routing, and timing using the modified netlist.

6. The method of claim 1 wherein the design is provided in the form of a netlist.

\* \* \* \* \*